(12) United States Patent
Lin et al.

(10) Patent No.: US 9,692,362 B2
(45) Date of Patent: Jun. 27, 2017

(54) AMPLIFIER CIRCUIT APPLIED TO DISPLAY APPARATUS

(71) Applicant: Raydium Semiconductor Corporation, Hsinchu (TW)

(72) Inventors: Yu-Chun Lin, Jinhu Township (TW); Yung-Hsiang Yang, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 15/013,705

(22) Filed: Feb. 2, 2016

(65) Prior Publication Data

US 2016/0240156 A1 Aug. 18, 2016

Related U.S. Application Data

(60) Provisional application No. 62/115,364, filed on Feb. 12, 2015.

(51) Int. Cl.
| | |
|---|---|
| *G09G 5/00* | (2006.01) |
| *H03F 1/52* | (2006.01) |
| *H03F 3/30* | (2006.01) |
| *H03F 3/45* | (2006.01) |
| *H03F 3/68* | (2006.01) |
| *G09G 3/36* | (2006.01) |

(52) U.S. Cl.
CPC ............ *H03F 1/52* (2013.01); *G09G 3/3685* (2013.01); *H03F 3/30* (2013.01); *H03F 3/45475* (2013.01); *H03F 3/68* (2013.01); *G09G 2310/0291* (2013.01); *G09G 2330/021* (2013.01); *G09G 2330/045* (2013.01); *H03F 2200/471* (2013.01); *H03F 2203/45116* (2013.01)

(58) Field of Classification Search
CPC ........ G09G 3/36; G09G 3/3685; G09G 1/005; H03F 3/30
USPC .................................................... 345/211.205
See application file for complete search history.

(56) References Cited

U.S. PATENT DOCUMENTS

| | | | |
|---|---|---|---|
| 8,350,612 B2 * | 1/2013 | Cheng .................. | H03K 17/223 327/261 |
| 9,230,495 B2 * | 1/2016 | Su ......................... | G09G 3/3614 |
| 9,570,002 B2 * | 2/2017 | Sakariya ............... | G06F 3/0412 |

* cited by examiner

*Primary Examiner* — Calvin C Ma

(57) ABSTRACT

An amplifier circuit applied to a source driver of a display apparatus includes a first input terminal, a second input terminal, an operational amplifier, an output stage and an output terminal. The first input terminal receives a first input signal. The second input terminal receives a second input signal. The operational amplifier is coupled to the first input terminal and second input terminal and receives the first input signal and second input signal and outputs a first control signal and a second control signal respectively. The output stage includes a first BJT and a second BJT coupled in series between a first terminal and a second terminal. The first BJT and second BJT are coupled to the operational amplifier and receive the first control signal and second control signal respectively. The output terminal is coupled between the first BJT and second BJT and outputs an output signal.

11 Claims, 2 Drawing Sheets

US 9,692,362 B2

AMPLIFIER CIRCUIT APPLIED TO DISPLAY APPARATUS

BACKGROUND OF THE INVENTION

Field of the Invention

This invention relates to an amplifier, especially to an amplifier circuit applied to a source driver of a display apparatus.

Description of the Related Art

Please refer to FIG. 1. FIG. 1 illustrates a schematic diagram of a conventional amplifier circuit applied in a source driver of a liquid crystal display. As shown in FIG. 1, the conventional amplifier circuit 1 applied in the source driver of the liquid crystal display is usually formed by a two-stage operational amplifying circuit 10 and an electrostatic discharge (ESD) protection circuit 12.

In fact, the two stages of the two-stage operational amplifying circuit 10 are a high-gain operational amplifier 100 and an output stage 102 having high driving capability. The output stage 102 is formed by two MOS transistors M1 and M2. Since the output terminal OUT of the amplifier circuit 1 is coupled to output pads, it is possible that the output terminal OUT of the amplifier circuit 1 receives the static electricity; therefore, the ESD protection circuit 12 is disposed in the amplifier circuit 1 to protect the two-stage operational amplifying circuit 10 from being damaged by the static electricity.

As shown in FIG. 1, the ESD protection circuit 12 of the amplifier circuit 1 is usually formed by two bipolar junction transistors (BJTs) 120 and 122 coupled in series. The PNP BJT 120 is coupled to the power source terminal SUP to form a PN diode; the NPN BJT 122 is coupled to the ground terminal GND to form another PN diode. Once the output terminal OUT of the amplifier circuit 1 receives the static electricity, the above-mentioned PN diodes will guide the static electricity to the power source terminal SUP or the ground terminal GND to avoid the damage caused by the static electricity flowing into the two-stage operational amplifying circuit 10.

In practical applications, if the output stage OUT and the negative input terminal INN of the two-stage operational amplifying circuit 10 are directly coupled to form a negative feedback or coupled through the passive component (e.g., a resistor), it can be used as a buffer. At this time, under the imaginary short effect of the amplifier, the output voltage at the output terminal OUT of the two-stage operational amplifying circuit 10 is equal or similar to the input voltage received by the positive input terminal INP of the two-stage operational amplifying circuit 10. In the applications of the source driver of the LCD apparatus, it is necessary to use the two-stage operational amplifying circuit 10 as the buffer to smoothly drive the equivalent multiple stages RC series load terminal of the LCD apparatus.

The amplifier circuit in the above-mentioned prior art have the following drawbacks of: (1) the layout area of the ESD protection circuit 12 and the output stage 102 of the two-stage operational amplifying circuit 10 are too larger, so that the cost of the amplifier circuit 1 is high and the area is hard to be reduced; (2) the slew rate of the amplifier circuit 1 caused by the parasitic capacitance generated by the diode circuit and the metal cable in the ESD protection circuit 12, so that the dynamic power consumption and the temperature of the amplifier circuit are increased.

SUMMARY OF THE INVENTION

Therefore, the invention provides an amplifier circuit applied to a source driver of a display apparatus to solve the above-mentioned problems.

A preferred embodiment of the invention is an amplifier circuit. In this embodiment, the amplifier circuit is applied to a source driver of a display apparatus. The amplifier circuit includes a first input terminal, a second input terminal, an operational amplifier, an output stage and an output terminal. The first input terminal is configured to receive a first input signal. The second input terminal is configured to receive a second input signal. The operational amplifier is coupled to the first input terminal and the second input terminal respectively and configured to receive the first input signal and the second input signal respectively and output a first control signal and a second control signal respectively. The output stage includes a first bipolar junction transistor (BJT) and a second BJT coupled in series between a first terminal and a second terminal. The first BJT and the second BJT are coupled to the operational amplifier respectively and configured to receive the first control signal and the second control signal respectively. The output terminal is coupled between the first BJT and the second BJT and configured to output an output signal.

In an embodiment, the first BJT is a PNP BJT and the second BJT is a NPN BJT.

In an embodiment, when the output terminal of the amplifier circuit receives a static electricity, the first BJT and the second BJT guide the static electricity to the first terminal or the second terminal respectively to avoid the static electricity flowing to the operational amplifier.

In an embodiment, the first input signal is a positive input signal and the second input signal is a negative input signal.

In an embodiment, the output terminal is coupled to the second input terminal to form a buffer.

In an embodiment, a first voltage at the first terminal is larger than a second voltage at the second terminal, and the operational amplifier is operated under a voltage difference obtained by subtracting the second voltage from the first voltage.

In an embodiment, the amplifier circuit includes a third input terminal, a fourth input terminal, another operational amplifier, another output stage and another output terminal. The third input terminal is configured to receive a third input signal. The fourth input terminal is configured to receive a fourth input signal. The another operational amplifier is coupled to the third input signal and the fourth input signal respectively and configured to receive the third input signal and the fourth input signal and output a third control signal and a fourth control signal respectively. The another output stage includes a third BJT and a fourth BJT coupled in series between the second terminal and a third terminal between the second BJT and the third BJT. The third BJT and the fourth BJT are coupled to the another operational amplifier respectively and configured to receive the third control signal and the fourth control signal respectively. The output terminal is coupled between the first BJT and the second BJT and configured to output an output signal.

In an embodiment, the third BJT is a PNP BJT and the fourth BJT is a NPN BJT.

In an embodiment, when the another output terminal of the amplifier circuit receives a static electricity, the third BJT and the fourth BJT guide the static electricity to the third terminal or the second terminal respectively to avoid the static electricity flowing to the another operational amplifier.

In an embodiment, the third input signal is a positive input signal and the fourth input signal is a negative input signal.

In an embodiment, a first voltage at the first terminal is larger than a third voltage at the third terminal and the third voltage at the third terminal is larger than a second voltage at the second terminal; the operational amplifier is operated under a voltage difference obtained by subtracting the third voltage from the first voltage and the another amplifier is operated under another voltage difference obtained by subtracting the second voltage from the third voltage.

Compared to the prior art, the amplifier circuit applied to the source driver of the display apparatus uses the output stage formed by the BJTs. Since the BJTs having both high driving capability and high ESD protection capability can provide the functions of output stage and ESD protection at the same time, the output stage of the amplifier circuit can replace the output stage formed by the MOS transistors in the two-stage amplifying circuit of the prior art to reduce the number of circuit elements and the costs. Because the number of circuit elements is reduced, the difficulties of the layout will be reduced and the parasitic capacitance at the output terminal of the amplifier circuit will be also reduced; therefore, the slew rate of the amplifier circuit will be increased accordingly. Furthermore, since multiple amplifier circuits can be operated in different ranges of operation voltage smaller than that of the prior art respectively, the amplifier circuit of the invention can effectively reduce the power consumption of every amplifier circuits to achieve the effects of saving power and reducing temperature.

The advantage and spirit of the invention may be understood by the following detailed descriptions together with the appended drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

A preferred embodiment of the invention is an amplifier circuit. In this embodiment, the amplifier circuit is applied to a source driver of a liquid crystal display apparatus, but not limited to this.

Figure 1:
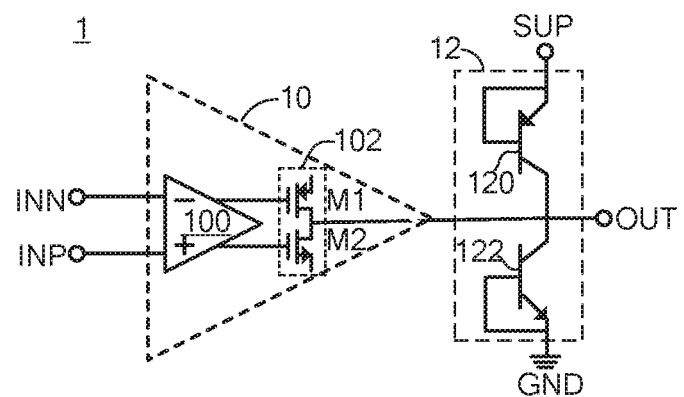
FIG. 1 illustrates a schematic diagram of a conventional amplifier circuit applied to a source driver of a liquid crystal display apparatus.
Figure 2:
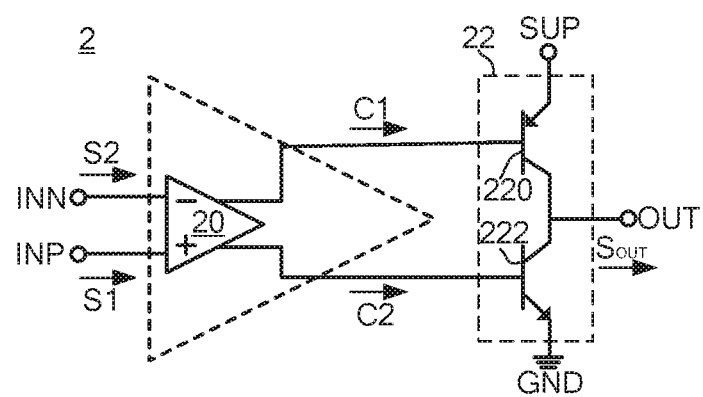
FIG. 2 illustrates a schematic diagram of an amplifier circuit applied to a source driver of a liquid crystal display apparatus in a preferred embodiment of the invention.

Please refer FIG. 2. FIG. 2 illustrates a schematic diagram of an amplifier circuit in this embodiment. As shown in FIG. 2, the amplifier circuit 2 includes a first input terminal INP, a second input terminal INN, an operational amplifier 20, an output stage 22 and an output terminal OUT. The output stage 22 includes a first BJT 220 and a second BJT 222. Wherein, the positive input terminal + and the negative input terminal − of the operational amplifier 20 are coupled to the first input terminal INP and the second input terminal INN. The first BJT 220 and the second BJT 222 are coupled in series between a first terminal (a power source terminal) SUP and a second terminal (a ground terminal) GND. The first BJT 220 and the second BJT 222 are coupled to the operational amplifier 20 respectively. The output terminal OUT is coupled between the first BJT 220 and the second BJT 222.

In this embodiment, the first input terminal INP is configured to receive a first input signal S1. The second input terminal INN is configured to receive a second input signal S2. The positive input terminal + and the negative input terminal − of the operational amplifier 20 receive the first input signal S1 and the second input signal S2 respectively. The operational amplifier 20 outputs a first control signal C1 and a second control signal C2 respectively. The first BJT 220 and the second BJT 222 receive the first control signal C1 and the second control signal C2 respectively. The output terminal OUT will output an output signal SOUT.

In practical applications, the first input signal S1 is a positive input signal and the second input signal S2 is a negative input signal, but not limited to this. The first BJT 220 can be a PNP BJT and the second BJT 222 can be a NPN BJT, but not limited to this. A first voltage at the first terminal (the power source terminal) SUP is larger than a second voltage at the second terminal (the ground terminal) GND, so that the operational amplifier 20 is operated under a voltage difference obtained by subtracting the second voltage from the first voltage.

It should be noticed that the BJTs have both high driving capability and high ESD protection capability; therefore, the output stage 22 formed by the first BJT 220 and the second BJT 222 can not only save layout area but also provide the ESD protection.

For example, when the output terminal OUT of the amplifier circuit 2 receives the static electricity, the first BJT 20 and the second BJT 222 will guide the static electricity to the first terminal (the power source terminal) SUP or the second terminal (the ground terminal) GND respectively to avoid the damages caused by the static electricity flowing into the operational amplifier 20.

Figure 3:
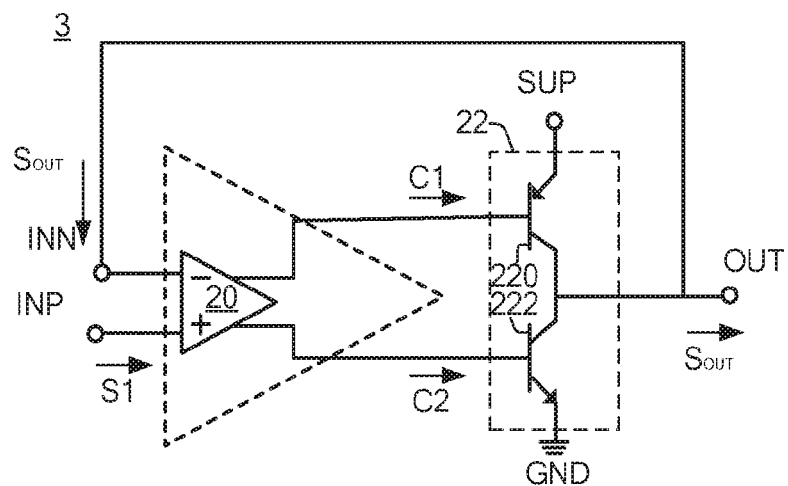
FIG. 3 illustrates a schematic diagram of the amplifier circuit used as a buffer.

Then, please refer to FIG. 3. In the amplifier circuit 3, the output terminal OUT of the amplifier circuit 3 is coupled to the second input terminal INN to form a buffer. By doing so, the negative input terminal − of the operational amplifier 20 will receive the output signal SOUT from the output terminal OUT. At this time, under the imaginary short effect of the operational amplifier 20, the voltage of the output signal SOUT at the output terminal OUT will be equal or similar to the voltage of the first input voltage S1 received by the positive input terminal INP. Since the driving capability of the BJTs is high enough, in the applications of the source driver of the LCD apparatus, the amplifier circuit 3 used as a buffer can smoothly drive the equivalent multiple stages RC series load terminal of the LCD apparatus.

Figure 4:
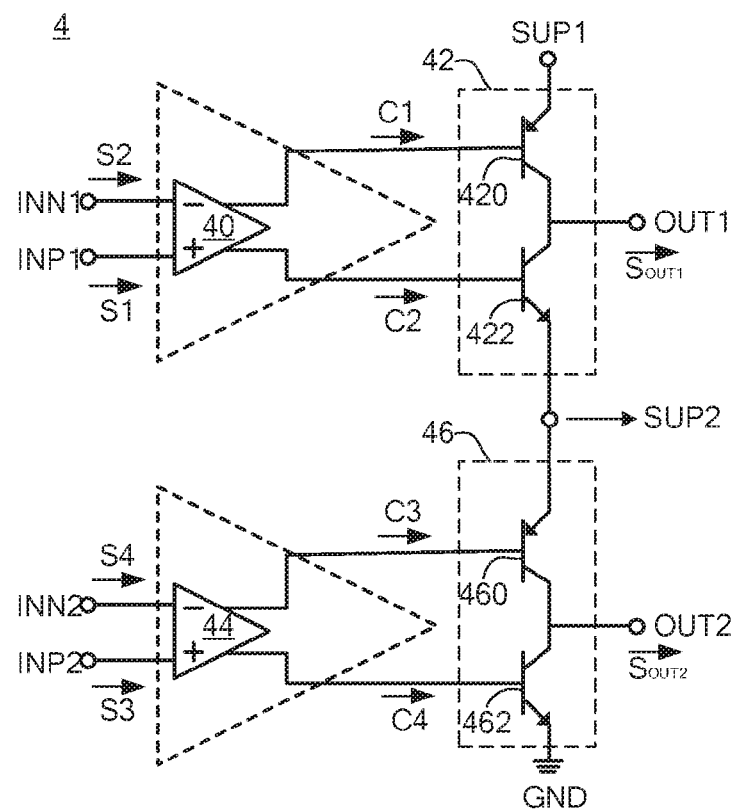
FIG. 4 illustrates a schematic diagram of an amplifier circuit applied to a source driver of a liquid crystal display apparatus in another preferred embodiment of the invention.

Another preferred embodiment of the invention is also an amplifier circuit. As shown in FIG. 4, the amplifier circuit 4 includes a first input terminal INP1, a second input terminal INN1, an operational amplifier 40, an output stage 42, an output terminal OUT1, a third input terminal INP2, a fourth input terminal INN2, another operational amplifier 44, another output stage 46 and another output terminal OUT2. The output stage 42 includes a first BJT 420 and a second BJT 422. The output stage 46 includes a third BJT 460 and a fourth BJT 462.

The positive input terminal + and the negative input terminal − of the operational amplifier 40 are coupled to the first input terminal INP1 and the second input terminal INN1 respectively. The first BJT 420 and the second BJT 422 are coupled in series between a first terminal (a power source terminal) SUP1 and a third terminal (a node between the second BJT 422 and the third BJT 460) SUP2. The first BJT 420 and the second BJT 422 are coupled to the operational amplifier 40 respectively. The output terminal OUT1 is coupled between the first BJT 420 and the second BJT 422.

The positive input terminal + and the negative input terminal − of the operational amplifier 44 are coupled to the third input terminal INP2 and the fourth input terminal INN2 respectively. The third BJT 460 and the fourth BJT 462 are coupled in series between the third terminal (the node between the second BJT 422 and the third BJT 460) SUP and a second terminal (a ground terminal) GND. The third BJT 460 and the fourth BJT 462 are coupled to the operational amplifier 44 respectively. The output terminal OUT2 is coupled between the third BJT 460 and the fourth BJT 462.

The first input terminal INP1 is configured to receive a first input signal S1. The second input terminal INN1 is configured to receive a second input signal S2. The positive input terminal + and the negative input terminal − of the operational amplifier 40 receive the first input signal S1 and the second input signal S2 respectively. The operational amplifier 40 outputs a first control signal C1 and a second control signal C2 respectively. The first BJT 420 an the second BJT 422 receive the first control signal C1 and the second control signal C2 respectively. The output terminal OUT1 will output a first output signal SOUT1.

The third input terminal INP2 is configured to receive a third input signal S3. The fourth input terminal INN2 is configured to receive a fourth input signal S4. The positive input terminal + and the negative input terminal − of the operational amplifier 44 receive the third input signal S3 and the fourth input signal S4 respectively. The operational amplifier 44 outputs a third control signal C3 and a fourth control signal C4 respectively. The third BJT 460 and the fourth BJT 462 receive the third control signal C3 and the fourth control signal C4 respectively. The output terminal OUT2 will output a second output signal SOUT2.

In practical applications, the third BJT 460 can be a PNP BJT and the fourth BJT 462 can be a NPN BJT, but not limited to this. When the output terminal OUT2 of the amplifier circuit 4 receives the static electricity, the third BJT 460 and the fourth BJT 462 will guide the static electricity to the third terminal SUP2 or the second terminal GND respectively, so that the static electricity will not flow into the operational amplifier 44.

In an embodiment, the third input signal S3 is a positive input signal and the fourth input signal S4 is a negative input signal.

In an embodiment, a first voltage at the first terminal SUP1 is larger than a third voltage at the third terminal SUP2 and the third voltage at the third terminal SUP2 is larger than a second voltage at the second terminal GND; the operational amplifier 40 can be operated under a voltage difference obtained by subtracting the third voltage from the first voltage and the amplifier 44 can be operated under the voltage difference obtained by subtracting the second voltage from the third voltage. Therefore, a better power saving effect can be achieved, but not limited to this. In fact, the operational amplifiers 40 and 44 can be also normally operated under the voltage difference obtained by subtracting the second voltage from the first voltage without any specific limitations.

By doing so, the voltage difference between the third voltage and the first voltage that the operational amplifier 40 is operated and the voltage difference between the second voltage and the third voltage that the operational amplifier 44 is operated are both smaller than that of the prior art; therefore, the power consumed when the operational amplifiers 40 and 44 are operated can be effectively reduced to achieve the effects of saving power and decreasing temperature.

Compared to the prior art, the amplifier circuit applied to the source driver of the display apparatus uses the output stage formed by the BJTs. Since the BJTs having both high driving capability and high ESD protection capability can provide the functions of output stage and ESD protection at the same time, the output stage of the amplifier circuit can replace the output stage formed by the MOS transistors in the two-stage amplifying circuit of the prior art to reduce the number of circuit elements and the costs. Because the number of circuit elements is reduced, the difficulties of the layout will be reduced and the parasitic capacitance at the output terminal of the amplifier circuit will be also reduced; therefore, the slew rate of the amplifier circuit will be increased accordingly. Furthermore, since multiple amplifier circuits can be operated in different ranges of operation voltage smaller than that of the prior art respectively, the amplifier circuit of the invention can effectively reduce the power consumption of every amplifier circuits to achieve the effects of saving power and reducing temperature.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

The invention claimed is:

1. An amplifier circuit applied to a source driver of a display apparatus, the amplifier circuit comprising:
   a first input terminal configured to receive a first input signal;
   a second input terminal configured to receive a second input signal;
   an operational amplifier, coupled to the first input terminal and the second input terminal respectively, configured to receive the first input signal and the second input signal respectively and output a first control signal and a second control signal respectively;
   an output stage comprising a first bipolar junction transistor (BJT) and a second BJT coupled in series between a first terminal and a second terminal, the first BJT and the second BJT being coupled to the operational amplifier respectively and configured to receive the first control signal and the second control signal respectively; and
   an output terminal coupled between the first BJT and the second BJT and configured to output an output signal.

2. The amplifier circuit of claim 1, wherein the first BJT is a PNP BJT and the second BJT is a NPN BJT.

3. The amplifier circuit of claim 1, wherein when the output terminal of the amplifier circuit receives a static electricity, the first BJT and the second BJT guide the static electricity to the first terminal or the second terminal respectively to avoid the static electricity flowing to the operational amplifier.

4. The amplifier circuit of claim 1, wherein the first input signal is a positive input signal and the second input signal is a negative input signal.

5. The amplifier circuit of claim 1, wherein the output terminal is coupled to the second input terminal to form a buffer.

6. The amplifier circuit of claim 1, wherein a first voltage at the first terminal is larger than a second voltage at the second terminal, and the operational amplifier is operated under a voltage difference obtained by substracting the second voltage from the first voltage.

7. The amplifier circuit of claim 1, further comprising:
a third input terminal configured to receive a third input signal;
a fourth input terminal configured to receive a fourth input signal;
another operational amplifier, coupled to the third input signal and the fourth input signal respectively, configured to receive the third input signal and the fourth input signal and output a third control signal and a fourth control signal respectively;
another output stage comprising a third BJT and a fourth BJT coupled in series between the second terminal and a third terminal between the second BJT and the third BJT, the third BJT and the fourth BJT being coupled to the another operational amplifier respectively and configured to receive the third control signal and the fourth control signal respectively; and
another output terminal coupled between the third BJT and the fourth BJT and configured to output another output signal.

8. The amplifier circuit of claim 7, wherein the third BJT is a PNP BJT and the fourth BJT is a NPN BJT.

9. The amplifier circuit of claim 7, wherein when the another output terminal of the amplifier circuit receives a static electricity, the third BJT and the fourth BJT guide the static electricity to the third terminal or the second terminal respectively to avoid the static electricity flowing to the another operational amplifier.

10. The amplifier circuit of claim 7, wherein the third input signal is a positive input signal and the fourth input signal is a negative input signal.

11. The amplifier circuit of claim 7, wherein a first voltage at the first terminal is larger than a third voltage at the third terminal and the third voltage at the third terminal is larger than a second voltage at the second terminal; the operational amplifier is operated under a voltage difference obtained by subtracting the third voltage from the first voltage and the another amplifier is operated under another voltage difference obtained by subtracting the second voltage from the third voltage.

* * * * *